United States Patent
Bhatia et al.

(10) Patent No.: US 8,073,021 B2
(45) Date of Patent: Dec. 6, 2011

(54) METHODS FOR OBTAINING STABILIZED OUTPUT BEAMS FROM FREQUENCY CONVERTED LIGHT SOURCES AND FREQUENCY CONVERTED LIGHT SOURCES UTILIZING THE SAME

(75) Inventors: Vikram Bhatia, Painted Post, NY (US); Dragan Pikula, Horseheads, NY (US); Madhan Mothi Raj, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 187 days.

(21) Appl. No.: 12/476,303

(22) Filed: Jun. 2, 2009

(65) Prior Publication Data

US 2010/0303107 A1      Dec. 2, 2010

(51) Int. Cl.
*H01S 3/10* (2006.01)
*H01S 3/13* (2006.01)

(52) U.S. Cl. ............................ 372/20; 372/29.011

(58) Field of Classification Search .............. 372/20, 372/97, 96, 29.011
See application file for complete search history.

(56) References Cited

U.S. PATENT DOCUMENTS

| 5,832,009 A | 11/1998 | Kikuchi | 372/21 |
| 7,505,492 B2 | 3/2009 | Gollier et al. | 372/29.011 |
| 2002/0105997 A1 | 8/2002 | Zhang | 372/70 |
| 2004/0165641 A1* | 8/2004 | Garnache et al. | 372/97 |
| 2008/0089369 A1 | 4/2008 | Luo et al. | 372/28 |
| 2008/0279234 A1* | 11/2008 | Gollier et al. | 372/29.011 |

* cited by examiner

*Primary Examiner* — Patrick Stafford
(74) *Attorney, Agent, or Firm* — Svetlana Z. Short

(57) ABSTRACT

A method for operating a frequency converted light source includes sweeping a wavelength control signal of a semiconductor laser over an initial signal range and measuring an optical power of an output beam emitted from a wavelength conversion device coupled to the semiconductor laser. The wavelength control signal of the semiconductor laser may then be swept over at least one truncated signal range and the optical power of the resulting output beam is measured. The at least one truncated signal range may be centered on a point corresponding to a maximum power of the output beam of the sweep of the wavelength control signal over the preceding signal range. An operational signal range for the wavelength control signal is determined such that a midpoint of the operational signal range corresponds to the maximum optical power of the resulting output beam of the sweep over the preceding signal range. Closed-loop feedback control of the wavelength control signal in the operational signal range may then be initiated.

20 Claims, 6 Drawing Sheets

METHODS FOR OBTAINING STABILIZED OUTPUT BEAMS FROM FREQUENCY CONVERTED LIGHT SOURCES AND FREQUENCY CONVERTED LIGHT SOURCES UTILIZING THE SAME

BACKGROUND OF THE INVENTION

1. Field of the Invention

The present invention generally relates to semiconductor lasers, laser controllers, frequency converted light sources, and other optical systems incorporating semiconductor lasers. More specifically, the present invention relates to methods for producing a stable output beam from a frequency converted light source that includes, inter alia, a semiconductor laser optically coupled to a second harmonic generation (SHG) crystal, or another type of wavelength conversion device.

2. Technical Background

Short wavelength frequency converted light sources can be formed by combining a single-wavelength semiconductor laser, such as an infrared or near-infrared distributed feedback (DFB) laser, distributed Bragg reflector (DBR) laser, or Fabry-Perot laser, with a light wavelength conversion device, such as a second harmonic generation (SHG) crystal. Typically, the SHG crystal is used to generate higher harmonic waves of the fundamental beam of the semiconductor laser. To do so, the wavelength of the fundamental beam is preferably tuned to the spectral center of the phase matching band of the wavelength converting SHG crystal and the fundamental beam is preferably aligned with the waveguide portion at the input facet of the wavelength converting crystal.

The phase matching band of typical SHG crystals, such as MgO-doped periodically poled lithium niobate (MgO:PPLN) crystals, may have a bandwidth of less than one nanometer. For example, in some MgO:PPLN crystals the phase matching bandwidth may be less than about 0.25 nm. However, the wavelength of the fundamental beam emitted by the semiconductor laser may be tunable over a range of several nanometers. Accordingly, it may be challenging to tune the fundamental beam emitted by the semiconductor laser such that the wavelength of the fundamental beam corresponds to the spectral center of the phase matching band thereby optimizing the light output of the wavelength conversion device.

Tuning the laser to the spectral center of the phase matching band may be further complicated due to thermal fluctuations which occur in the frequency converted light source, particularly during start-up of the frequency converted light source. For example, the laser wavelength tuning mechanism may be thermally coupled to the semiconductor laser such that the tuning signal changes whenever the lasing current and/or laser temperature changes. Further, the spectral center of the phase matching band of the SHG crystal may fluctuate with changes in temperature. Both conditions may cause the power and/or wavelength of light emitted from the wavelength conversion device to vary.

While thermal fluctuations may occur during operation of the frequency converted light source, particularly large thermal fluctuations occur when the frequency converted light source is switched on (e.g., during a cold start). These large thermal fluctuations may last from five to ten seconds during which time it may be difficult to tune the fundamental beam of the semiconductor laser with the spectral center of the phase matching band of the SHG crystal thereby prolonging the start time of the frequency converted light source.

Accordingly, alternative methods are needed for operating a frequency converted light source such that the output beam emitted from the frequency converted light source is rapidly stabilized.

SUMMARY OF THE INVENTION

According to one embodiment shown and described herein, a method for operating a frequency converted light source comprising a semiconductor laser optically coupled to a wavelength conversion device includes sweeping a wavelength control signal of the semiconductor laser over an initial signal range and measuring an optical power of a resulting frequency converted output beam emitted from the wavelength conversion device. The wavelength control signal of the semiconductor laser may then be swept over at least one truncated signal range and the optical power of the resulting frequency converted output beam measured. The at least one truncated signal range may be less than a preceding signal range and the at least one truncated signal range may be centered on a point corresponding to a maximum power of the frequency converted output beam of the sweep of the wavelength control signal over the preceding signal range. An operational signal range for the wavelength control signal is determined such that a midpoint of the operational signal range corresponds to the maximum optical power of the resulting frequency converted output beam of the sweep of the wavelength control signal over the preceding signal range. Thereafter, closed-loop feedback control of the wavelength control signal in the operational signal range may be initiated.

In another embodiment shown and described herein, a frequency converted light source includes a semiconductor laser optically coupled to a wavelength conversion device and a package controller electrically coupled to the semiconductor laser. The package controller may be operable to control a wavelength of a fundamental beam emitted by the semiconductor laser. The package controller may also be programmed to provide a wavelength control signal to a wavelength selective section of the semiconductor laser when the frequency converted light source is powered on, sweep the wavelength control signal of the semiconductor laser over an initial signal range, and measure an optical power of a resulting frequency converted output beam emitted from the wavelength conversion device. The package controller may also be programmed to sweep the wavelength control signal of the semiconductor laser over at least one truncated signal range and measure the optical power of the resulting frequency converted output beam. The at least one truncated signal range may be less than a preceding signal range and the at least one truncated signal range may be centered on a point corresponding to a maximum optical power of the resulting frequency converted output beam of the sweep of the wavelength control signal over the preceding signal range. Thereafter, the package controller may be operable to determine an operational signal range for the wavelength control signal based on the output power of the resulting frequency converted output beam of the sweep of the wavelength control signal over the preceding signal range and initiate closed-loop feedback control of the wavelength control signal in the operational signal range.

Additional features and advantages of the invention will be set forth in the detailed description which follows, and in part will be readily apparent to those skilled in the art from that description or recognized by practicing the invention as described herein, including the detailed description which follows, the claims, as well as the appended drawings.

It is to be understood that both the foregoing general description and the following detailed description present embodiments of the invention, and are intended to provide an overview or framework for understanding the nature and character of the invention as it is claimed. The accompanying drawings are included to provide a further understanding of the invention, and are incorporated into and constitute a part of this specification. The drawings illustrate various embodiments of the invention, and together with the description serve to explain the principles and operations of the invention.

DETAILED DESCRIPTION OF THE PREFERRED EMBODIMENTS

Figure 1:
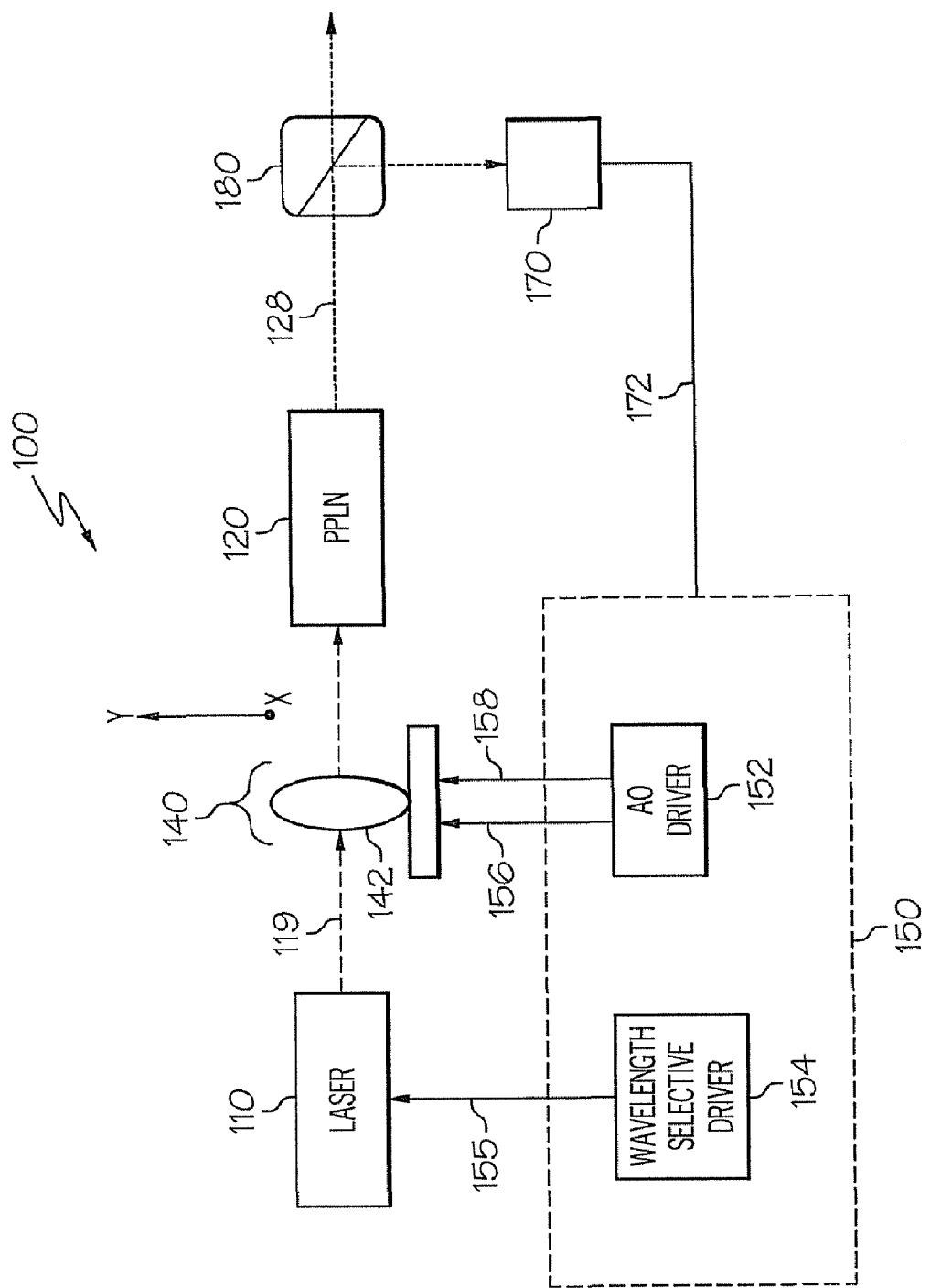
FIG. 1 is a schematic diagram of a frequency converted light source according to one embodiment shown and described herein.

Reference will now be made in detail to embodiments of the invention, examples of which are illustrated in the accompanying drawings. Whenever possible, the same reference numerals will be used throughout the drawings to refer to the same or like parts. One embodiment of a frequency converted light source for use in conjunction with the control methods described herein is shown in FIG. 1. The frequency converted light source generally comprises a semiconductor laser, adaptive optics, a wavelength conversion device and a package controller. The output of the semiconductor laser is optically coupled into the input facet of the wavelength conversion device with the adaptive optics. The package controller is electrically coupled to the semiconductor laser and the adaptive optics and configured to control the output of the semiconductor laser and the alignment of the semiconductor laser with the wavelength conversions device. Various components and configurations of the frequency converted light source and methods for controlling the frequency converted light source to produce a stabilized output beam will be described further herein.

FIG. 1 generally depicts one embodiments of a frequency converted light source 100 described herein. It should be understood that the solid lines and arrows indicate the electrical interconnectivity of various components of the frequency converted light source. These solid lines and arrows are also indicative of electrical signals propagated between the various components including, without limitation, electronic control signals, data signals and the like. Further, it should also be understood that the dashed lines and arrows indicate light beams of different wavelengths emitted by the semiconductor laser and the wavelength conversion device. It will be understood that the terms "light" and "light beams," as used herein, generally refer to various wavelengths of light in the ultraviolet ("UV"), visible, and infrared ("IR") portions of the electromagnetic spectrum.

Referring initially to FIG. 1, the concepts of particular embodiments of the present invention may be conveniently illustrated with general reference to the frequency converted light source 100 which may comprise, for example, a semiconductor laser 110 optically coupled to a wavelength conversion device 120. A fundamental light beam 119 emitted by the semiconductor laser, such as an infrared light beam, may be either directly coupled into the waveguide portion of the wavelength conversion device 120 or coupled into the waveguide portion of wavelength conversion device 120 using adaptive optics 140. The wavelength conversion device 120 converts the fundamental light beam 119 of the semiconductor laser 110 into higher harmonic waves and outputs a frequency converted light beam 128 having a different wavelength than the fundamental light beam 119 of the semiconductor laser 110. This type of frequency converted light source is particularly useful in generating shorter wavelength laser beams from longer wavelength semiconductor lasers and can be used, for example, as a visible light source for laser projection systems.

Figure 2:
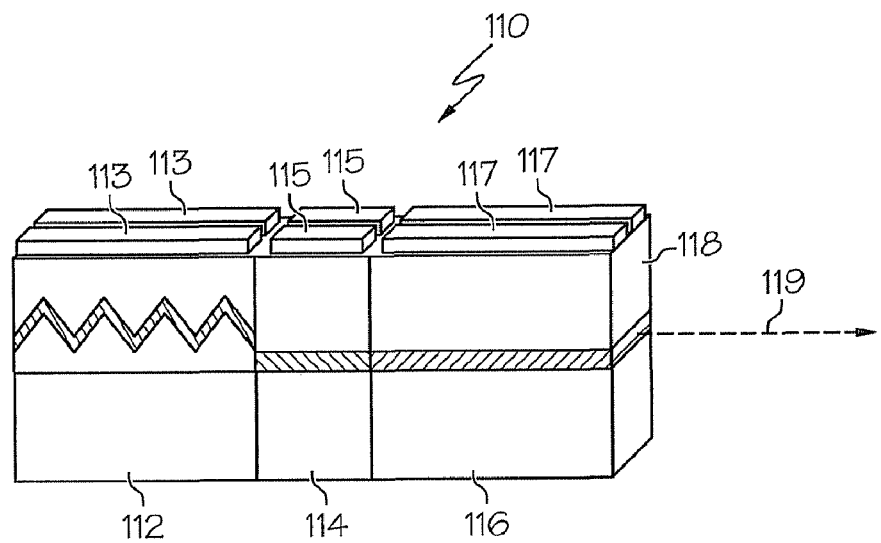
FIG. 2 depicts one embodiment of a semiconductor laser for use in conjunction with one or more embodiments of the frequency converted light source shown and described herein.

Referring to FIG. 2, the semiconductor laser 110 is schematically illustrated. The semiconductor laser 110 may generally comprise a wavelength selective section 112, a phase matching section 114, and a gain section 116. The wavelength selective section 112, which may also be referred to as the distributed Bragg reflector or DBR section of the semiconductor laser 110, typically comprises a first order or second order Bragg grating positioned outside the active region of the laser cavity. This section provides wavelength selection, as the grating acts as a mirror whose reflection coefficient depends on the wavelength of light incident on the grating. The gain section 116 of the semiconductor laser 110 provides the major optical gain of the laser and the phase matching section 114 creates an adjustable optical path length or phase shift between the gain material of the gain section 116 and the reflective material of the wavelength selective section 112. It will be understood that the wavelength selective section 112 may be provided in a number of suitable alternative configurations that may or may not employ a Bragg grating.

Still referring to FIG. 2, respective control electrodes 113, 115, 117 are incorporated in the wavelength selective section 112, the phase matching section 114, the gain section 116, or combinations thereof, and are merely illustrated schematically in FIG. 2. It is contemplated that the control electrodes 113, 115, 117 may take a variety of forms. For example, the control electrodes 113, 115, 117 are illustrated in FIG. 2 as respective electrode pairs but it is contemplated that single electrode elements in one or more of the sections 112, 114, 116 will also be suitable for practicing particular embodiments of the present invention. The control electrodes 113, 115, 117 can be used to inject electrical current into the corresponding sections 112, 114, 116 of the semiconductor laser 110. For example, in one embodiment, current injected in to the wavelength selective section 112 of the semiconductor laser 110 can be used to control the wavelength $\lambda_1$ of the fundamental light beam emitted by the semiconductor laser by altering the operating properties of the laser. For example, when the fundamental light beam 119 is an infrared light beam emitted from the output facet 118 of the semiconductor laser 110, the wavelength $\lambda_1$ of the infrared light beam 119 may be adjusted by providing a wavelength control signal to the wavelength selective section 112. The wavelength control signal may be used to control the temperature of the wavelength selective section 112 or the index of refraction of the wavelength selective section 112.

In one embodiment, the wavelength selective section 112 may comprise a heater (not shown), such as a thin film microheater, or a similar type of resistive heater. In one embodiment, the heater is thermally coupled to the grating of the wavelength selective section 112. However, it will be understood that other configurations of the heater within the wavelength selective section are possible. An electrical signal, such as a current and/or voltage applied to the heater raises the temperature of the heater and, in turn, the temperature of the wavelength selective section 112 of the semiconductor laser 110. The increase in temperature changes the properties of the lasing cavity within the wavelength selective section 112 and, as a result, the wavelength of the fundamental beam 119 emitted by the semiconductor laser 110. Accordingly, it should be understood that, by providing the wavelength selective section 112 with an electrical control signal (e.g., a wavelength control signal), the wavelength of the fundamental beam 119 may be tuned to a specific wavelength. For the infrared semiconductor lasers described herein, the tuning range may be greater than about 3 nm.

In another embodiment described herein, the wavelength of the fundamental beam emitted by the semiconductor laser 110 changes in proportion to the square of the voltage applied to the wavelength selective section. Accordingly, in one embodiment, in order to provide a linear correlation between the wavelength control signal and the resulting change in the wavelength of the fundamental beam 119 of the semiconductor laser 110, the square root of the wavelength control signal is applied to the wavelength selective section in order to obtain the desired change in wavelength. However, it will be understood that the wavelength of the fundamental beam emitted by the semiconductor laser may also vary in direct proportion to the voltage applied to the wavelength selective section 112 of the semiconductor laser 110.

While FIG. 2 shows one embodiment of a semiconductor laser 110 in which the wavelength selective section is contained within the semiconductor device, it should be understood that other configurations are possible. For example, in one embodiment (not shown) the grating used for wavelength selection may be an external or intra-cavity grating. For example, in one embodiment the grating may be disposed between the output facet 118 of the semiconductor laser 110 and the input facet 126 of the wavelength conversion device 120. In another embodiment, the grating may be located proximate the output facet 122 of the wavelength conversion device 120. In either embodiment the grating may be thermally coupled to a heater such that, when a wavelength control signal is applied to the heater, the temperature of the heater is adjusted which, in turn, adjusts the temperature of the grating and, as a result, the wavelength of light which is passed through the grating.

Figure 3:
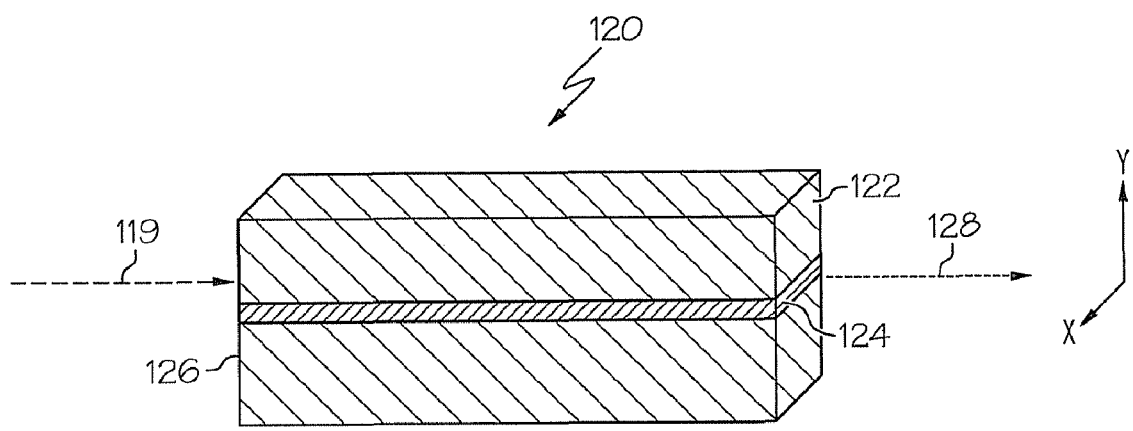
FIG. 3 depicts one embodiment of a wavelength conversion device for use in conjunction with one or more embodiments of the frequency converted light source shown and described herein.

Referring now to FIG. 3, the wavelength conversion device 120 generally comprises a non-linear optical crystal, such as a second harmonic generation (SHG) crystal. In one embodiment, the wavelength conversion device 120 may comprise a lithium niobate bulk crystal with an MgO-doped, periodically polled lithium niobate (MgO:PPLN) waveguide portion. In this embodiment, the waveguide portion of the wavelength conversion device may be operable to convert the fundamental output beam of the semiconductor laser to higher order harmonics.

While specific reference is made herein to certain types of wavelength conversion devices and/or waveguides for converting a fundamental beam to a higher order harmonic beam, it should be understood that other, similar non-linear optical materials may be used for the wavelength conversion device and/or the waveguide portion of the wavelength conversion device. For example, the bulk crystal material or the waveguide portion of the wavelength conversion device may include, without limitation, potassium titanyl phosphate (KTP), zinc-oxide doped periodically poled lithium niobate (ZnO:PPLN), lithium tantalate (LT), doped LT, near stochiometric LT, near stochiometric lithium niobate, and the like. Similarly, it will be understood that the wavelength conversion device may comprise a bulk MgO:PPLN crystal or similar non-linear optical material. Further, it should be understood that the wavelength conversion device may be a second harmonic generation (SHG) crystal or a non-linear optical crystal capable of converting light to higher order (e.g., $3^{rd}$, $4^{th}$, etc.) harmonics. It should also be understood that the wavelength conversion device and/or waveguide portion of the wavelength conversion device may be a machined waveguide, an etched waveguide, an ion-implanted waveguide or a diffused waveguide.

The wavelength conversion device 120 generally comprises an input facet 126 and an output facet 122. The waveguide portion 124 of the wavelength conversion device 120 extends between the input facet 126 to the output facet 122. When the waveguide portion 124 of the wavelength conversion device 120 is a MgO:PPLN crystal, the waveguide portion 124 may have dimensions (e.g., height and width) on the order of about 5 microns. In one embodiment, when the fundamental beam 119 directed into the waveguide portion 124 of the wavelength conversion device 120 is an infrared light beam, the infrared light beam may be propagated through the wavelength conversion device 120 where it is converted to a frequency converted light beam 128 which is emitted from the output facet 122 of the wavelength conversion device. For example, in one embodiment, the fundamental beam 119 emitted by the semiconductor laser 110 is an infrared light beam which is directed into the waveguide portion 124 of the wavelength conversion device 120. The infrared light beam may have a wavelength from about 1040 nm to about 1070 nm. In this embodiment, the wavelength conversion device 120 may be operable to convert the infrared light beam to visible green light such that the frequency converted light beam 128 has a wavelength from about 520 nm to about 535 nm.

The wavelength conversion device 120 and, more specifically, the waveguide portion 124 of the wavelength conversion device 120 may have a light acceptance band or phase matching band such that, when the fundamental beam of the semiconductor laser 110 is incident on the waveguide portion 124 and the fundamental beam has a wavelength which is within the bandwidth of the acceptance band of the waveguide portion 124, the output efficiency of the wavelength conversion device 120 (e.g., the output power of the frequency converted beam 128 emitted by the wavelength conversion device 120) is maximized. The acceptance bandwidth may vary with the inverse of the axial length of the waveguide portion 124 of the wavelength conversion device

120. For example, longer waveguide portions will have a smaller acceptance bandwidth than relatively shorter waveguide portions. For wavelength conversion devices employing MgO:PPLN waveguide portions, the acceptance bandwidth may be less than about one nanometer. For example, for some MgO:PPLN waveguides having a length of about 8 mm the acceptance bandwidth may be less than about 0.25 nm and the spectral center of the acceptance band may vary with fluctuations in temperature of the wavelength conversion device. Accordingly, the wavelength of the fundamental beam of the semiconductor laser must be precisely controlled in order to maximize the output power of the frequency converted output beam emitted from the wavelength conversion device 120.

While reference is made herein to the semiconductor laser 110 of the frequency converted light source 100 being operable to emit an infrared fundamental beam and the wavelength conversion device 120 being operable to convert the infrared fundamental beam to a visible light beam, it should be understood that the control methodologies described herein may be used in conjunction with frequency converted light sources 100 having semiconductor lasers which emit fundamental beams of different wavelengths and wavelength conversion devices operable to convert the fundamental beams to different wavelengths of visible light.

Referring now to FIG. 1, one embodiment of a frequency converted light source 100 is depicted in which the semiconductor laser 110 and the wavelength conversion device 120 have a substantially linear orientation. As shown in FIG. 1, the fundamental light beam 119 emitted by the semiconductor laser 110 is coupled into a waveguide portion of the wavelength conversion device 120 with adaptive optics 140 along a single optical pathway (e.g., the light beam is not diverted, such as by a mirror or other reflector, to a second or subsequent pathway between the semiconductor laser and the wavelength conversion device).

In the embodiment shown in FIG. 1 the adaptive optics 140 generally comprise an adjustable optical component, such as a lens 142. The lens 142 focuses the fundamental light beam 119 emitted by the semiconductor laser 110 into the waveguide portion of the wavelength conversion device 120. However, it should be understood that other types of lenses, multiple lenses, or other optical elements may be used. When the adjustable optical component comprises multiple lenses, the adjustable optical component may both collimate and focus the fundamental light beam 119. The lens 142 may be coupled to an actuator (not shown) for adjusting the position of the lens 142 in the x- and y-directions such that the lens 142 is an adjustable optical component. Adjusting the position of the lens in the x- and y-directions may facilitate positioning the fundamental light beam 119 along the input facet of the wavelength conversion device 120 and, more specifically, on the waveguide portion of the wavelength conversion device, such that the fundamental light beam 119 is aligned with the waveguide portion and the output of the wavelength conversion device 120 is optimized.

While FIG. 1 shows a frequency converted light source 100 in which the components are oriented in a substantially linear configuration, it should be understood that the components of the frequency converted light source may have other configurations. For example, in one embodiment (not shown), the semiconductor laser and the wavelength conversion device may be configured to form a folded optical pathway between the semiconductor laser and the wavelength conversion device. In this embodiment, the adaptive optics may comprise an adjustable mirror and a lens. The adjustable mirror and lens may be utilized to redirect the fundamental beam of the semiconductor laser from its initial pathway to a second or subsequent pathway and in to the wavelength conversion device while the lens may facilitate focusing and/or collimating the fundamental beam, as described hereinabove. Accordingly, it will be understood that the frequency converted light source, and more specifically, the semiconductor laser and wavelength conversion device may have various relative orientations. However, it should be understood that, regardless of the orientation of the semiconductor laser and the wavelength conversion device, the fundamental output beam of the semiconductor laser is coupled in to the waveguide portion of the wavelength conversion device.

Still Referring to FIG. 1, the frequency converted light source 100 may also comprise a beam splitter 180 positioned proximate the output of the wavelength conversion device 120. The beam splitter 180 redirects a portion of the frequency converted light beam 128 emitted from the wavelength conversion device 120 into an optical detector 170 which is used to measure the intensity of the emitted frequency converted light beam 128. The optical detector 170, which is coupled to the package controller 150 with lead 172, outputs an electrical signal proportional to the measured intensity of the frequency converted light beam 128.

The frequency converted light source 100 may also comprise a package controller 150. The package controller 150 may comprise one or more micro-controllers or programmable logic controllers which store and execute a programmed instruction set for operating the frequency converted light source 100. Alternatively, the micro-controllers or programmable logic controllers may be operable to directly execute an instruction set. The package controller 150 may be electrically coupled to the semiconductor laser 110, the adaptive optics 140 and the optical detector 170 and programmed to operate both the semiconductor laser 110 and the adaptive optics 140. The package controller 150 may also be operable to receive an output signal from the optical detector 170 and, based on the received output signal, output control signals to the adaptive optics 140 and the semiconductor laser 110. In one embodiment, the package controller 150 may comprise drivers 152, 154 for controlling the adaptive optics and the wavelength of the fundamental beam of the semiconductor laser, respectively.

The adaptive optics driver 152 may be coupled to the adaptive optics 140 with leads 156, 158 and supplies the adaptive optics 140 with x- and y-position control signals through the leads 156, 158, respectively. The x- and y-position control signals facilitate positioning the adjustable optical component of the adaptive optics in the x- and y-directions which, in turn, facilitates positioning the fundamental light beam 119 of the semiconductor laser 110 on the input facet of the wavelength conversion device 120.

In one embodiment, where the semiconductor laser comprises a wavelength selective section, as described herein and shown in FIG. 2, the wavelength selective driver 154 may be coupled to the wavelength selective section 112 of the semiconductor laser 110 with lead 155. The wavelength selective section driver 154 may be operable to supply the wavelength selective section 112 of the semiconductor laser 110 with wavelength control signal(s) which facilitate adjusting the wavelength $\lambda_1$ of the fundamental beam 119 emitted from the output facet of the semiconductor laser 110.

In another embodiment, where the frequency converted laser source 100 comprises an external grating, as described hereinabove, the wavelength selective driver may be electrically coupled to a heater thermally coupled to the grating. The wavelength selective driver may be operable to supply the heater with a wavelength control signal for adjusting the wavelength of light passed by the external grating, as described above.

As described hereinabove, large thermal transients may occur when the frequency converted light source is powered on. Such thermally transients may adversely effect the stability of the frequency converted output beam emitted by the wavelength conversion device until a temperature equilibrium is reached between the various components of the frequency converted light source. However, the temperature equilibrium may not be reached in a time frame which is compatible with the operating specifications of the frequency converted light source. Methods of operating the frequency converted light source to improve the start-up time (e.g., the time necessary to achieve a stable frequency converted output beam) will now be described.

Figure 4:
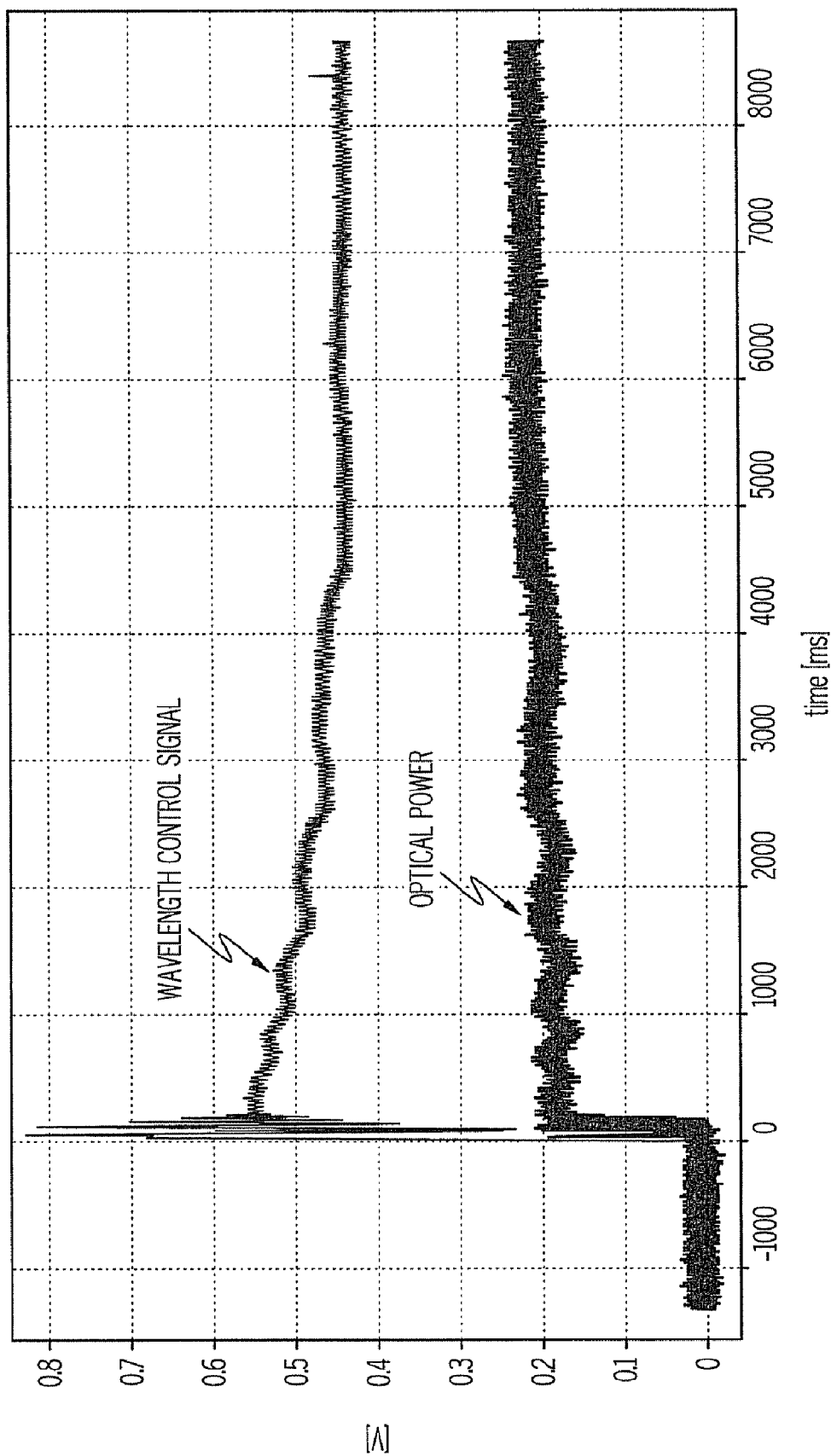
FIG. 4 graphically illustrates the power of the wavelength control signal as a function of time applied to the wavelength selective section of the semiconductor laser according to at least one embodiment described herein and the corresponding power of the frequency converted output beam emitted from the wavelength conversion device.

Referring now to FIGS. 1 and 4-7, an algorithm for operating a frequency converted light source to rapidly produce a stabilized output beam is graphically illustrated. As shown in FIG. 4, the algorithm includes sweeping the wavelength control signal of the semiconductor laser over progressively smaller signal ranges and measuring the corresponding change in the optical power of the wavelength conversion device. Following the initial sweep of the wavelength control signal, the range of each subsequent sweep is truncated with each subsequent signal range centered on a point corresponding to the power of the wavelength control signal which yields the maximum optical output power for the immediately preceding sweep. As shown in FIG. 4, sweeping the wavelength control signal causes the optical output power of the frequency converted output beam of the wavelength conversion device to fluctuate as the wavelength of light emitted by the semiconductor laser is scanned over the acceptance band of the wavelength conversion device. The process of sweeping and truncating is repeated multiple times until the resulting change in the optical output power is within a desired range corresponding to a frequency converted output beam having the desired stability. Thereafter, closed loop feedback control of the wavelength control signal may be initiated.

In the embodiments described herein, sweeping the wavelength control signal refers to utilizing the package controller 150 of the frequency converted light source 100 to adjust the wavelength control signal supplied to the wavelength selective section of the semiconductor laser 110. In the embodiments described herein, adjusting the wavelength control signal comprises varying the voltage of the wavelength control signal which, in turn, varies the electrical power dissipated in or converted to heat by the heater disposed in the wavelength control section 112 of the semiconductor laser 110 and, as such, the wavelength of light emitted by the semiconductor laser. In the embodiments described herein, the nominal efficiency of the semiconductor laser is approximately 7 nm/W. Accordingly, for every watt of electrical power dissipated into thermal energy in the wavelength selective section, the wavelength of light emitted by the semiconductor laser is increased by 7 nm.

While specific examples discussed herein describe varying the voltage of the wavelength control signal, it should be understood that the current of the wavelength control signal may also be varied to cause a corresponding change in the wavelength of the fundamental beam emitted from the semiconductor laser and, therefore, the wavelength of the frequency converted output beam emitted by the wavelength conversion device.

Figure 5:
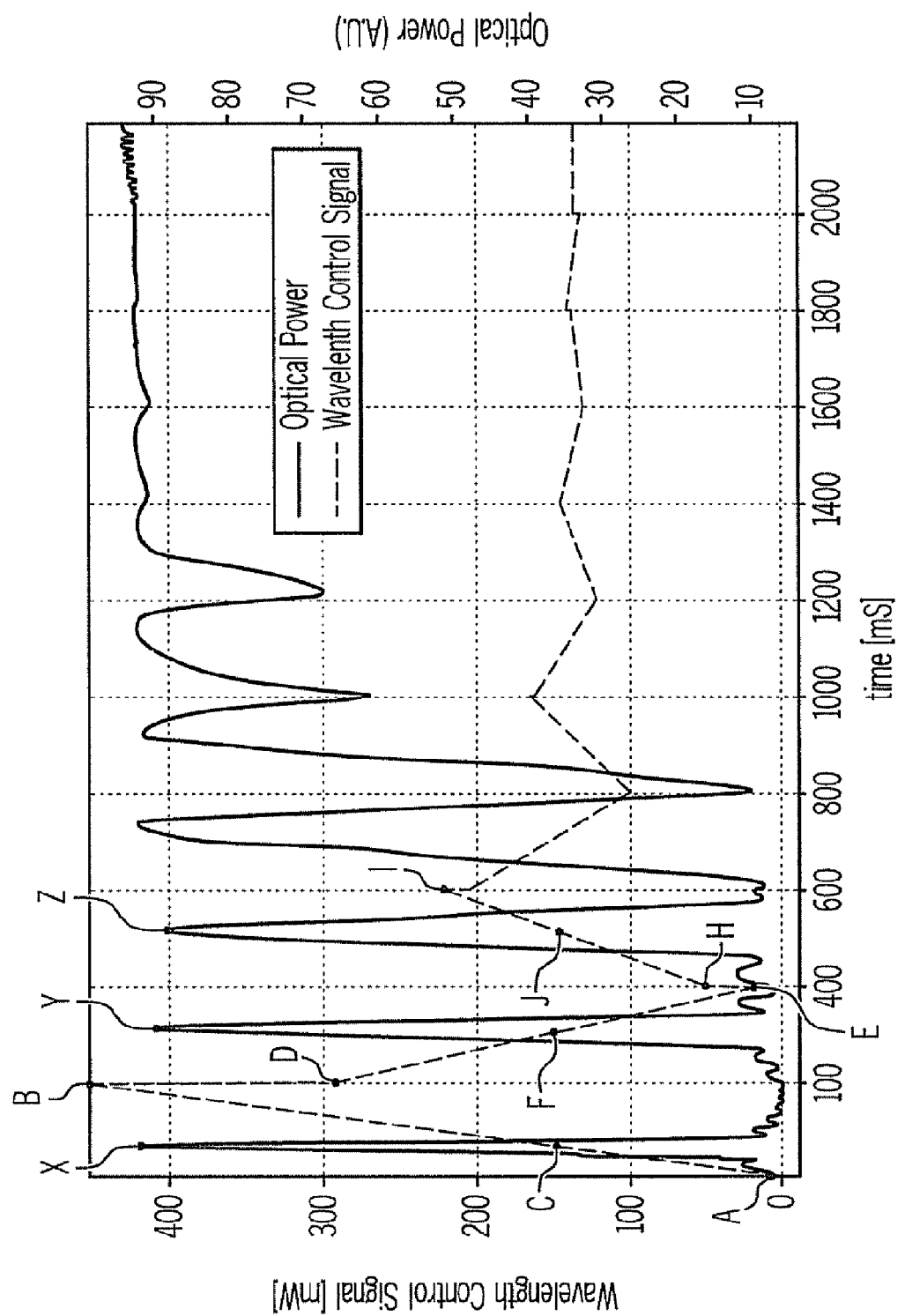
FIG. 5 graphically illustrates a portion of the wavelength control signal utilized during start-up of the frequency converted light source and the corresponding power of the frequency converted output beam emitted from the wavelength conversion device.
Figure 6:
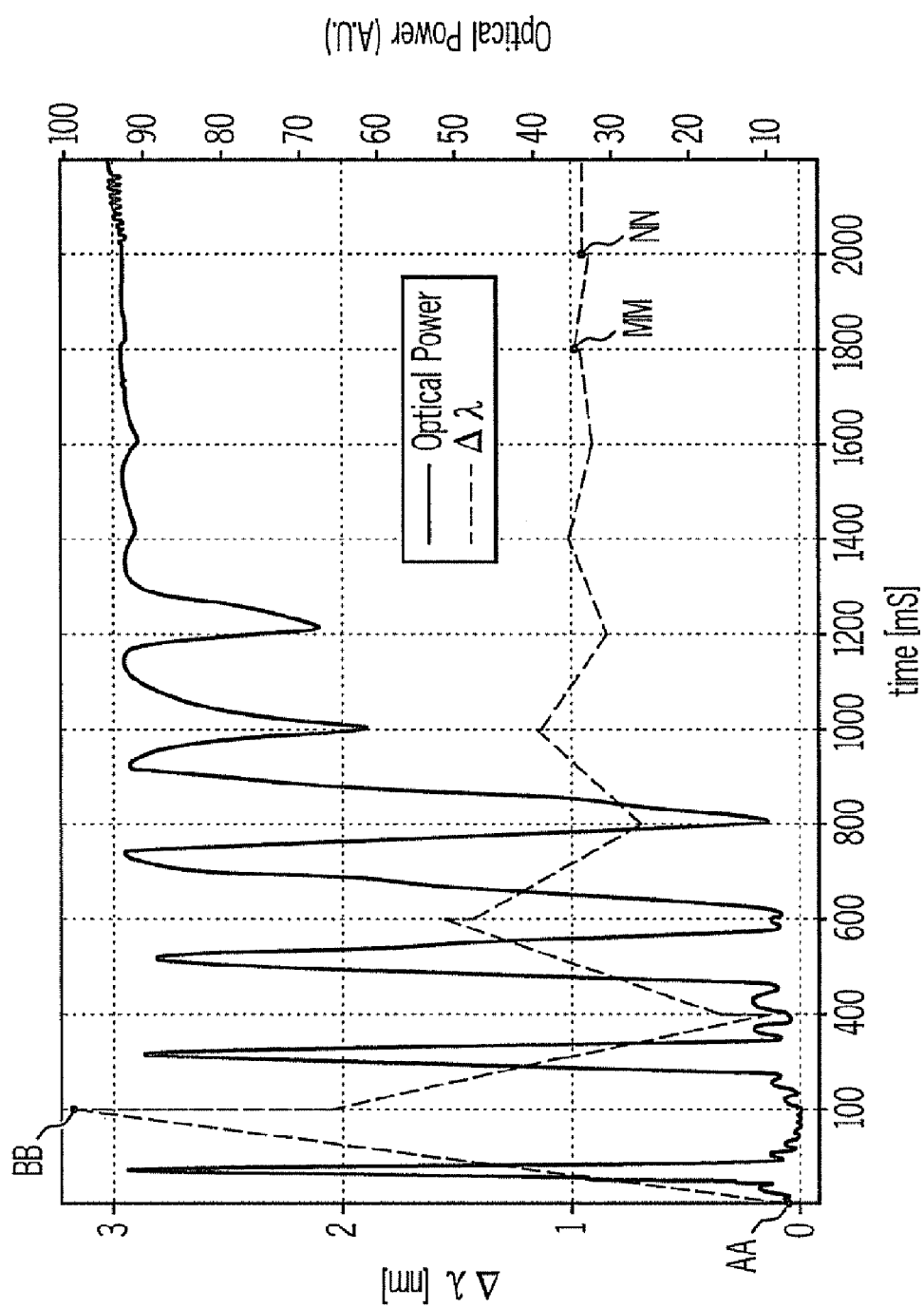
FIG. 6 is a graphic illustration of one embodiment of the start-up algorithm described herein showing the change in the wavelength of the semiconductor laser as the wavelength control signal is swept over consecutively truncated ranges and the corresponding changes in the optical output power of the frequency converted laser source.

FIG. 5 graphically depicts a portion of the wavelength control signal (in units of power) and the corresponding optical output power of the frequency converted output beam shown in FIG. 4. Specifically, FIG. 5 graphically depicts an algorithm executed by the package controller and utilized at startup of the frequency converted laser source in order to rapidly produce a stabilized frequency converted output beam from the frequency converted laser source. As shown in FIG. 4, the algorithm (e.g., the start-up algorithm) begins with a sweep of the wavelength control signal over an initial signal range. The initial signal range may correspond to the full wavelength control signal range of the semiconductor laser. Alternatively, the initial signal range may correspond to a predetermined signal range. In one embodiment, when the frequency converted laser source is initially switched on and the start-up algorithm is executed by the package controller for the first time, the initial signal range corresponds to the full wavelength control signal range of the semiconductor laser. Based on the results of this start-up algorithm, the package controller may be programmed to identify a suitable initial signal range for use in conjunction with each subsequent use of the start-up algorithm.

In the algorithm graphically depicted in FIG. 4, the initial signal range corresponds to the line segment between point A and point B of the wavelength control signal which, in turn, corresponds to a power dissipated in the wavelength control section from about 0 mW to about 450 mW. The power dissipated in the wavelength control section of the semiconductor laser 110 varies with the square of the voltage of the wavelength control signal and, as such, the change in the wavelength of the fundamental beam of the semiconductor laser also varies with the square of the voltage of the wavelength control signal. More specifically, the power dissipated in the wavelength selective section may be defined as $P_{WC}=V_{WC}^2/R_H$, where $P_{WC}$ is the electrical power dissipated as heat in the wavelength selective section, $V_{WC}$ is the voltage of the wavelength control signal, and $R_H$ is the resistance of the heater. Thus, for a heater having a resistance of about 20Ω, electrical power values from about 0 mW to about 450 mW correspond to a wavelength control signal having a voltage from about 0 volts to about 3 volts. Accordingly, it should now be understood that, in one embodiment, the wavelength control signal supplied to the wavelength selective section 112 of the semiconductor laser is converted to thermal energy or thermal power which is dissipated in the wavelength selective section thereby adjusting the wavelength of the fundamental beam emitted by the semiconductor laser.

In one embodiment, the sweep of the wavelength control signal over the initial signal range is performed in a plurality of steps. For example, in the embodiment shown in FIG. 5, the package controller 150 sweeps the wavelength control signal over the initial signal range in 100 discrete steps. In the embodiment shown, each step roughly corresponds to 4.5 mW. However, it should be understood that the number of steps in the examples described herein are exemplary and that more or fewer steps may be used.

Still referring to FIGS. 1 and 5, as the wavelength control signal is swept over the initial signal range, the package controller 150 measures the relative optical power of the frequency converted output beam 128 emitted by the wavelength conversion device 120. More specifically, the relative optical power of the frequency converted output beam 128 is measured by the optical detector 170 which, in turn, outputs an electronic signal to the package controller 150 proportional to the measured optical power of the frequency converted output beam 128. In the embodiments described herein, the optical power of the frequency converted output beam 128 is measured at the end of each step in the range.

As shown in FIG. 5, sweeping the wavelength control signal over the initial signal range causes the optical output power of the frequency converted output beam to vary from about zero to a maximum and back to about zero. This is because, as the wavelength control signal is swept over the initial range, the wavelength of the semiconductor laser is swept across the acceptance band of the wavelength conversion device. When the wavelength of the fundamental beam of the semiconductor laser is outside the acceptance band, the optical power of the frequency converted output beam is minimal. For example, in one embodiment, when the wavelength of the fundamental beam of the semiconductor laser is outside of the acceptance band of the wavelength conversion device, the power of the frequency converted output beam may be less than about 5 mW. Accordingly, it will be understood that sweeping the wavelength control signal over the initial signal range changes the wavelength of the fundamental beam of the semiconductor laser by an amount greater than the bandwidth of the acceptance band of the wavelength conversion device. For example, for a semiconductor laser having an efficiency of about 7 nm/W, sweeping the wavelength control signal over a range of about 450 mW produces a corresponding change in the wavelength of the fundamental beam of greater than about 3 nm, as shown by the line between points AA and BB in FIG. 6.

The optical power of the frequency converted output beam is monitored by the package controller 150 throughout the sweep of the wavelength control signal over the initial signal range. At the end of the sweep over the initial signal range, the package controller 150 is programmed to determine the value of the wavelength control signal which corresponds to the maximum optical output power of the frequency converted output beam. For example, referring to FIG. 5, the maximum optical output power for the sweep of the wavelength control signal from point A to point B is point X on the plot of the optical power of the frequency converted output beam. The maximum optical output power of the frequency converted output beam at point X generally corresponds to point C (approximately 150 mW) on the plot of the wavelength control signal.

Once the package controller has determined the value for the power of the wavelength control signal corresponding to the maximum optical output power of the initial signal range, the package controller sets the midpoint of a truncated signal range (e.g., the next signal range of the wavelength control signal) equal to the control signal corresponding to the maximum optical output power of the initial signal range.

The center wavelength of the acceptance bandwidth may drift during startup of the frequency converted light source thereby necessitating re-tuning of the output of the semiconductor laser. Accordingly, following the sweep of the wavelength control signal over the initial signal range, the package controller is programmed to sweep the wavelength control signal over at least one truncated signal range. In the embodiments described herein, each truncated signal range is approximately 60 percent of the immediately preceding signal range. Accordingly, for the example shown in FIG. 5, the first truncated signal range (e.g., the signal range immediately following the initial signal range), which corresponds to the line connecting point D and point E, is approximately 60 percent of the initial signal range or from about 285 mW to about 15 mW. It should be understood that 60 percent is an exemplary value and that larger or smaller percentages may be used for truncating consecutive signal ranges.

As noted herein, each consecutive signal range is centered on the point in the preceding signal range corresponding to the maximum optical output power of the frequency converted output beam from the preceding signal range. Accordingly, in the present example, the first truncated signal range is centered at about 150 mW.

In the embodiments described herein, each subsequent signal range (e.g., each truncated signal range) begins proximate the end point of the preceding signal range. For example, in FIG. 5 the initial signal range ends at about 450 mW while the first truncated signal range starts at about 285 mW instead of 0 mW. Accordingly, consecutive sweeps alternate between starting at the lower bound of the sweep and the upper bound of the sweep. Utilizing this convention, the overall time between sweeps may be reduced. However, it should be understood that the methods described herein may also be used when consecutive sweeps of the wavelength control signal start at the lower bound of the sweep or at the upper bound of the sweep.

With the midpoint of the first truncated signal range determined, the wavelength control signal is swept over the first truncated signal range. As described above, the wavelength control signal may be swept over the first truncated signal range in a plurality of steps. For example, the initial signal range and each truncated signal range each comprise 100 steps. Accordingly, for consecutive sweeps, if the number of steps is held constant and the size of the range is decreased, the length of each step in the sweep is reduced.

Further, as noted herein, the size of the each consecutive signal range is reduced by a predetermine percentage, which, in the examples cited, is approximately 60 percent. Similarly, the time taken to perform each consecutive sweep is also reduced. In the embodiments described herein the time taken to perform each consecutive sweep is approximately 60 percent of the time taken to perform the previous sweep. Accordingly, for an initial sweep having a duration of 50 milliseconds, the $10^{th}$ consecutive sweep will have a duration of less than about 2 milliseconds.

As the package controller 150 sweeps the wavelength control signal over the first truncated signal range the optical output power of the frequency converted output beam 128 is measured, as described above. After the sweep over the first truncated signal range is completed, the package controller 150 determines the maximum optical output power measured during the sweep of the wavelength control signal over the first truncated signal range and determines the value of the wavelength control signal which yields the maximum optical output power, as described above. The program controller 150 then sets the midpoint of the next subsequent truncated signal range to the value of the wavelength control signal corresponding to the maximum optical output power of the sweep of the wavelength control signal over the preceding truncated signal range.

Thereafter, the package controller 150 repeats the steps of sweeping the wavelength control signal over a truncated signal range, measuring the optical output power of the frequency converted laser source, and determining the wavelength control signal corresponding to the maximum optical output power. For example, in the embodiment shown in FIG. 5, the sweep of the wavelength control signal corresponding to the second truncated signal range corresponds to the line between point H and point I of the wavelength control signal while the maximum optical output power measured during the sweep (e.g., point Z) corresponds to point J on the plot of the wavelength control signal.

In the embodiments described herein the steps of sweeping the wavelength control signal over the truncated signal range, measuring the optical output power of the frequency converted laser source and determining the wavelength control signal corresponding to the maximum optical output power of the resulting frequency converted output beam are repeated until a suitable operational range is reached for the wavelength control signal of the semiconductor laser. In the embodiments described herein a suitable operational range is reached when, for a wavelength control signal varied across the operational range, the corresponding change in the wavelength of the fundamental beam of the semiconductor laser produces a change in the optical power of the frequency converted output beam of the wavelength conversion device which is less than 3% of the maximum optical output power of the wavelength conversion device. When the frequency converted output beam varies by less than 3% of the maximum optical output power, the frequency converted output beam is considered sufficiently stable.

In the embodiments described herein, the operational range may be determined following 10 sweeps of the wavelength control signal over progressively smaller signal ranges (e.g., 1 sweep over an initial signal range and 9 sweeps over successively truncated signal ranges). The operational range, specifically the midpoint of the operational range, is determined from the wavelength control signal corresponding to the maximum optical output power of the last sweep of the wavelength control signal over a truncated signal range. For example, in the embodiment shown in FIG. 5, each sweep of the wavelength control signal is about 60% of the preceding sweep. Accordingly, the $10^{th}$ sweep is over a truncated signal range corresponding to about 7.5 mW of dissipated power, as shown by the line between points MM and NN in FIG. 6, which corresponds to a wavelength control signal voltage range of about 0.387 V. Based on the efficiency of the semiconductor laser (e.g., 7 nm/W), a wavelength control signal falling within a dissipated power range of 7.5 mW produces a change in the wavelength of the semiconductor laser of ±0.026 nm which, in turn, causes a change in the power of the frequency converted output beam of the wavelength conversion device of less than about 3%. Accordingly, for the example shown in FIG. 5, the center point of the operational range is the wavelength control signal corresponding to the maximum optical output power of the $10^{th}$ sweep of the wavelength control signal which, in the example shown, corresponds to a value of about 135 mW.

In the embodiments shown and described herein, the operational range of the wavelength control signal is generally smaller than the bandwidth of the acceptance band of the waveguide portion of the wavelength conversion device. Further, the operational range may be centered within the acceptance band of the wavelength conversion device such that, if the wavelength control signal is varied across the entire operational range, the corresponding change in the wavelength of the fundamental beam of the semiconductor laser is within the acceptance band of the wavelength conversion device.

Figure 7:
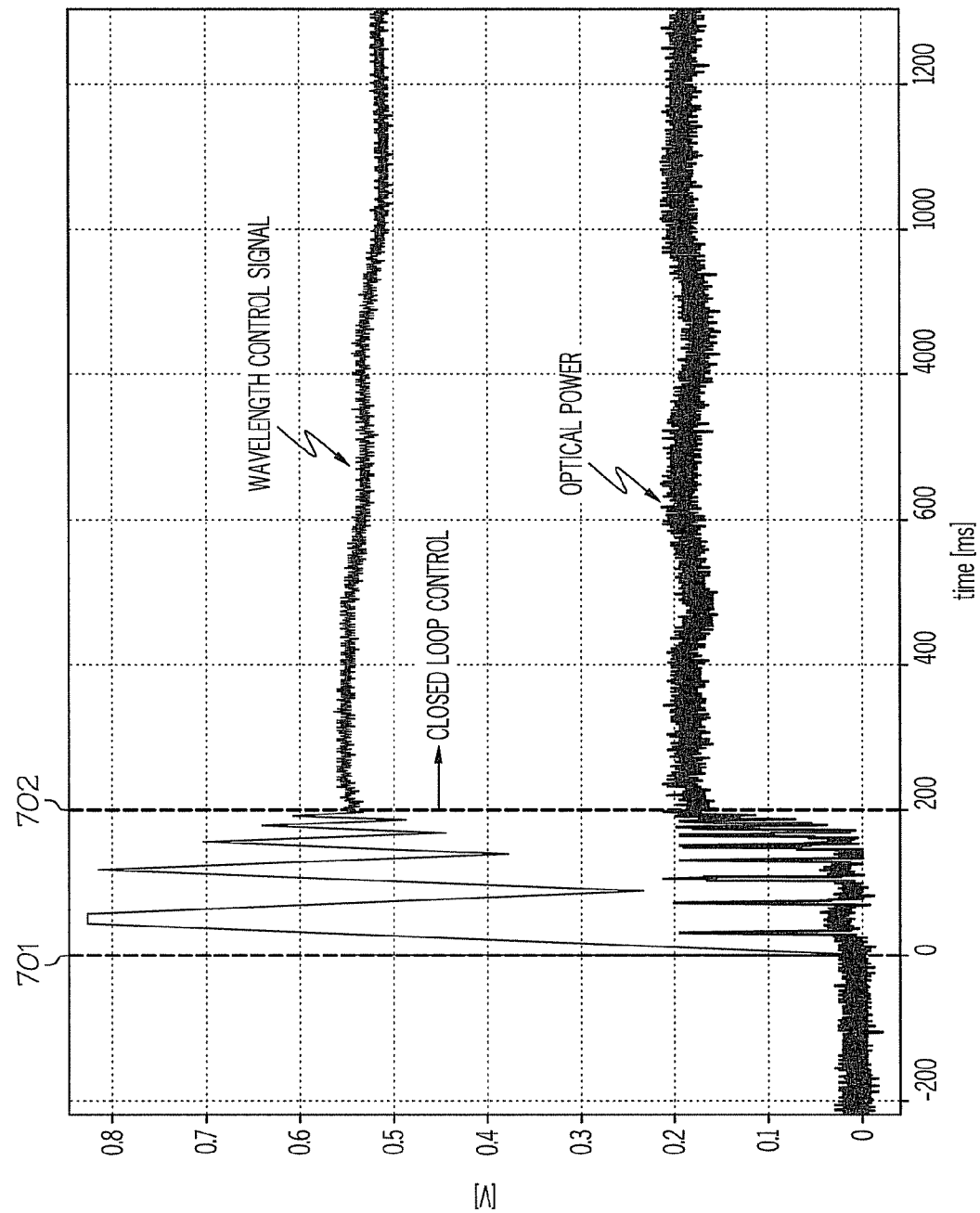
FIG. 7 graphically depicts one embodiment of the start-up algorithm described herein and subsequent closed loop control of the wavelength control signal and the corresponding power of the frequency converted output beam emitted from the wavelength conversion device.

Referring now to FIG. 7, the time elapsed from initiation of the start-up algorithm (e.g., the start up algorithm is initiated at the line 701) to identification of the operational range for the semiconductor laser which produces a stabilized output beam from the wavelength conversion device (e.g., at the line 702) is preferably less than 2 seconds, more preferably less than about 1 second and most preferably less than about 0.2 seconds. For example, in the embodiments shown herein, the start-up algorithm is completed and the operational range of the wavelength control signal is determined within about 150 milliseconds after the frequency converted light source is initially switched on.

After the operational range has been determined, the package controller is programmed to initiate closed-loop feedback control of the wavelength control signal utilizing the identified operational range. For example, in one embodiment, closed-loop feedback control such as that disclosed in U.S. Pat. No. 7,505,492 entitled "Alignment of Lasing Wavelength With Wavelength Conversion Peak Using Modulated Wavelength Control Signal" and assigned to Corning Inc., may be used for closed-loop feedback control. However, it will be understood that other types of closed-loop feedback control may also be utilized in conjunction with the method described herein. Regardless of the type of closed-loop feedback control used, it will be understood that the method described herein may be utilized to establish an initial operation range for the semiconductor laser such that the wavelength conversion device produces a stabilized output beam.

It should now be understood that the frequency converted light sources and methods for operating frequency converted light sources described herein may be utilized to rapidly produce a stabilized output beam from a wavelength conversion device upon start-up of the frequency converted laser source. Accordingly, the methods and apparatus described herein may be utilized to reduce the start-up time of frequency converted light sources.

It is to be understood that the preceding detailed description of the invention is intended to provide an overview or framework for understanding the nature and character of the invention as it is claimed. It will be apparent to those skilled in the art that various modifications and variations can be made to the present invention without departing from the spirit and scope of the invention. Thus, it is intended that the present invention cover the modifications and variations of this invention provided they come within the scope of the appended claims and their equivalents.

For the purposes of defining and describing the present invention, it is noted that reference herein to values that are "on the order of" a specified magnitude should be taken to encompass any value that does not vary from the specified magnitude by one or more orders of magnitude. It is also noted that one or more of the following claims recites a controller "programmed to" execute one or more recited acts. For the purposes of defining the present invention, it is noted that this phrase is introduced in the claims as an open-ended transitional phrase and should be interpreted in like manner as the more commonly used open-ended preamble term "comprising." In addition, it is noted that recitations herein of a component of the present invention, such as a controller being "programmed" to embody a particular property, function in a particular manner, etc., are structural recitations, as opposed to recitations of intended use. More specifically, the references herein to the manner in which a component is "programmed" denotes an existing physical condition of the component and, as such, is to be taken as a definite recitation of the structural characteristics of the component.

It is noted that terms like "preferably," "commonly," and "typically," when utilized herein, are not intended to limit the scope of the claimed invention or to imply that certain features are critical, essential, or even important to the structure or function of the claimed invention. Rather, these terms are merely intended to highlight alternative or additional features that may or may not be utilized in a particular embodiment of the present invention. Further, it is noted that reference to a value, parameter, or variable being a "function of" another value, parameter, or variable should not be taken to mean that the value, parameter, or variable is a function of one and only one value, parameter, or variable.

For the purposes of describing and defining the present invention it is noted that the term "substantially" is utilized herein to represent the inherent degree of uncertainty that may be attributed to any quantitative comparison, value, measurement, or other representation. The term "substantially" is also utilized herein to represent the degree by which a quantitative representation. e.g., "substantially above zero," varies from a stated reference, e.g., "zero," and should be interpreted to require that the quantitative representation varies from the stated reference by a readily discernable amount.

What is claimed is:

1. A method for operating a frequency converted light source comprising a semiconductor laser optically coupled to a wavelength conversion device, the method comprising:
   (i) sweeping a wavelength control signal of the semiconductor laser over an initial signal range and measuring an optical power of a resulting frequency converted output beam emitted from the wavelength conversion device;
   (ii) sweeping the wavelength control signal of the semiconductor laser over at least one truncated signal range and measuring the optical power of the resulting frequency converted output beam, wherein the at least one truncated signal range is less than a preceding signal range and the at least one truncated signal range is centered on a point corresponding to a maximum optical power of a frequency converted output beam of the sweep of the wavelength control signal over the preceding signal range;
   (iii) determining an operational signal range for the wavelength control signal, wherein a midpoint of the operational signal range corresponds to the maximum optical power of the resulting frequency converted output beam of the sweep of the wavelength control signal over the preceding signal range; and
   (iv) initiating closed-loop feedback control of the wavelength control signal in the operational signal range.

2. The method of claim 1 wherein the wavelength control signal is swept over the initial signal range and the at least one truncated signal range in a plurality of steps.

3. The method of claim 1 wherein a starting point of the at least one truncated signal range is proximate an end point of the preceding signal range.

4. The method of claim 1 wherein sweeping the wavelength control signal over the initial signal range changes a wavelength of a fundamental beam of the semiconductor laser by an amount greater than a bandwidth of an acceptance band of the wavelength conversion device.

5. The method of claim 4 wherein the bandwidth of the acceptance band of the wavelength conversion device is less than about 1 nm and sweeping the wavelength control signal over the initial signal range changes the wavelength of the fundamental beam of the semiconductor laser by greater than about 3 nm.

6. The method of claim 1 further comprising adjusting the wavelength control signal within the operational signal range during closed-loop feedback control such that a corresponding change in a wavelength of a fundamental beam emitted by the semiconductor laser is less than or equal to the bandwidth of the acceptance band of the wavelength conversion device.

7. The method of claim 1 wherein, when the semiconductor laser is operated in the operational signal range, the optical power of the frequency converted output beam emitted from the wavelength conversion device is ±3% of the maximum optical power of the wavelength conversion device.

8. The method of claim 1 wherein the at least one truncated signal range is about 60% of the preceding signal range.

9. The method of claim 1 wherein the method is performed when the frequency converted light source is powered on.

10. The method of claim 9 wherein closed-loop feedback control is initiated less than 2 seconds after the frequency converted light source is powered on.

11. The method of claim 1 wherein changes to the wavelength control signal adjust a temperature of a wavelength selective section of the semiconductor laser.

12. The method of claim 1 wherein the semiconductor laser is operable to emit an infrared fundamental beam and the wavelength conversion device is operable to convert the infrared fundamental beam to visible light.

13. The method of claim 12 wherein the infrared fundamental beam has a wavelength from about 1040 nm to about 1070 nm and the visible light has a wavelength from about 520 nm to about 535 nm.

14. A frequency converted light source comprising a semiconductor laser optically coupled to a wavelength conversion device and a package controller electrically coupled to the semiconductor laser and operable to control a wavelength of a fundamental beam emitted by the semiconductor laser, wherein the package controller is programmed to:
   provide a wavelength control signal to a wavelength selective section of the semiconductor laser when the frequency converted light source is powered on;
   sweep the wavelength control signal of the semiconductor laser over an initial signal range and measure an optical power of a resulting frequency converted output beam emitted from the wavelength conversion device;
   sweep the wavelength control signal of the semiconductor laser over at least one truncated signal range and measure the optical power of the resulting frequency converted output beam, wherein the at least one truncated signal range is less than a preceding signal range and the at least one truncated signal range is centered on a point corresponding to a maximum optical power of the resulting frequency converted output beam of the sweep of the wavelength control signal over the preceding signal range;
   determine an operational signal range for the wavelength control signal based on the optical power of the resulting frequency converted output beam of the sweep of the wavelength control signal over the preceding signal range; and
   initiate closed-loop feedback control of the wavelength control signal in the operational signal range.

15. The frequency converted light source of claim 14 wherein the package controller is programmed to sweep the wavelength control signal over the initial signal range and the at least one truncated signal range in a plurality of steps.

16. The frequency converted light source of claim 14 wherein a starting point of the at least one truncated signal range is proximate an end point of the preceding signal range.

17. The frequency converted light source of claim 14 wherein sweeping the wavelength control signal over the initial signal range changes a wavelength of the fundamental beam of the semiconductor laser by an amount greater than a bandwidth of an acceptance band of the wavelength conversion device.

18. The frequency converted light source of claim 14 wherein the package controller is programmed to adjust the wavelength control signal within the operational signal range during closed-loop feedback control such that a corresponding change in a wavelength of the fundamental beam emitted by the semiconductor laser is less than or equal to the bandwidth of the acceptance band of the wavelength conversion device.

19. The frequency converted light source of claim 14 wherein, when the semiconductor laser is operated in the operational signal range, the optical power of the resulting frequency converted output beam emitted from the wavelength conversion device is ±3% of the maximum optical power of the wavelength conversion device.

20. The frequency converted light source of claim 14 wherein the semiconductor laser is operable to emit a fundamental beam having a wavelength from about 1040 nm to about 1070 nm and the wavelength conversion device is operable to convert the infrared fundamental beam to visible light having a wavelength from about 520 nm to about 535 nm.

* * * * *